United States Patent
Kim et al.

(10) Patent No.: US 9,117,890 B2
(45) Date of Patent: Aug. 25, 2015

(54) HIGH-ELECTRON MOBILITY TRANSISTOR AND METHOD OF MANUFACTURING THE SAME

(71) Applicant: Samsung Electronics Co., Ltd., Suwon-Si, Gyeonggi-Do (KR)

(72) Inventors: Jong-seob Kim, Hwaseong-si (KR); Kyoung-yeon Kim, Seongnam-si (KR); Joon-yong Kim, Seoul (KR); Jai-kwang Shin, Anyang-si (KR); Jae-joon Oh, Seongnam-si (KR); Hyuk-soon Choi, Hwaseong-si (KR); Jong-bong Ha, Yongin-si (KR); Sun-kyu Hwang, Seoul (KR); In-jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/910,417

(22) Filed: Jun. 5, 2013

(65) Prior Publication Data

US 2014/0097470 A1    Apr. 10, 2014

(30) Foreign Application Priority Data

Oct. 9, 2012    (KR) ........................ 10-2012-0112092

(51) Int. Cl.
*H01L 29/66*    (2006.01)
*H01L 29/778*    (2006.01)
(Continued)

(52) U.S. Cl.
CPC .......... *H01L 29/778* (2013.01); *H01L 29/1066* (2013.01); *H01L 29/66431* (2013.01);
(Continued)

(58) Field of Classification Search
CPC .................. H01L 29/66318; H01L 29/66348; H01L 29/66431; H01L 29/66477; H01L 29/66484; H01L 29/78; H01L 29/7801; H01L 29/66462; H01L 29/778; H01L 29/7781; H01L 29/7782; H01L 29/7783
USPC ............ 257/194, E29.246, E29.248, E29.249
See application file for complete search history.

(56) References Cited

U.S. PATENT DOCUMENTS 7,429,534 B2    9/2008    Gaska et al.
7,663,161 B2    2/2010    Kaibara et al.
(Continued)

FOREIGN PATENT DOCUMENTS

JP    2007-066979 A    3/2007
JP    2011-066464 A    3/2011
(Continued)

OTHER PUBLICATIONS

Uemoto, Y. et al. "Gate Injection Transistor (GIT)—A Normally-Off AlGaM/GaN Power Transistor Using Conductivity Modulation" (2007) IEEE Transactions on Electron Devices, vol. 54, No. 12: 3393-3399.

*Primary Examiner* — Jae Lee
*Assistant Examiner* — Mohammed R Alam
(74) *Attorney, Agent, or Firm* — Harness, Dickey & Pierce, P.L.C.

(57) ABSTRACT

According to example embodiments, a HEMT includes a channel supply layer on a channel layer, a p-type semiconductor structure on the channel supply layer, a gate electrode on the p-type semiconductor structure, and source and drain electrodes spaced apart from two sides of the gate electrode respectively. The channel supply layer may have a higher energy bandgap than the channel layer. The p-type semiconductor structure may have an energy bandgap that is different than the channel supply layer. The p-type semiconductor structure may include a hole injection layer (HIL) on the channel supply layer and be configured to inject holes into at least one of the channel layer and the channel supply in an on state. The p-type semiconductor structure may include a depletion forming layer on part of the HIL. The depletion forming layer may have a dopant concentration that is different than the dopant concentration of the HIL.

17 Claims, 16 Drawing Sheets

(51) Int. Cl.
  *H01L 29/10* (2006.01)
  *H01L 29/417* (2006.01)
  *H01L 29/20* (2006.01)

(52) U.S. Cl.
  CPC ...... *H01L29/66462* (2013.01); *H01L 29/7786* (2013.01); *H01L 29/2003* (2013.01); *H01L 29/41766* (2013.01)

(56) References Cited

U.S. PATENT DOCUMENTS

| | | | |
|---|---|---|---|
| 7,683,399 | B2 | 3/2010 | Ishida et al. |
| 7,772,055 | B2 | 8/2010 | Germain et al. |
| 7,898,002 | B2 | 3/2011 | Hikita et al. |
| 8,114,717 | B2 | 2/2012 | Palacios et al. |
| 2008/0006845 | A1 | 1/2008 | Derluyn et al. |
| 2008/0079023 | A1 | 4/2008 | Hikita et al. |
| 2008/0105880 | A1 | 5/2008 | Edwards et al. |
| 2008/0149965 | A1 | 6/2008 | Kaibara et al. |
| 2009/0146182 | A1* | 6/2009 | Hikita et al. ............ 257/190 |
| 2010/0327293 | A1* | 12/2010 | Hikita et al. ............ 257/76 |
| 2012/0032185 | A1 | 2/2012 | Sandhu et al. |
| 2012/0097973 | A1 | 4/2012 | Shi et al. |

FOREIGN PATENT DOCUMENTS

| | | |
|---|---|---|
| KR | 20040008523 A | 1/2004 |
| KR | 2004-0050865 A | 6/2004 |
| KR | 10-1027138 B1 | 4/2011 |
| KR | 10-1078143 B1 | 10/2011 |
| KR | 2012-0010951 A | 2/2012 |

* cited by examiner

HIGH-ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2012-0112092, filed on Oct. 9, 2012, in the Korean Intellectual Property Office, the disclosure of which is incorporated herein in its entirety by reference.

BACKGROUND

1. Field

Example embodiments relate to a high-electron mobility transistor (HEMT) and/or a method of manufacturing the same and, more particularly, to a HEMT having normally-off characteristics and/or a method of manufacturing the same.

A. 2. Description of the Related Art

In a power conversion system, an efficiency of a power switching device may affect the efficiency of the entire system. Although a power metal oxide semiconductor field effect transistor (power MOSFET) using silicon or an insulated gate bipolar transistor (IGBT) have mostly been used as a switching device, there is a technical limit to increasing the efficiency of the switching device due to the material limitations of silicon itself.

Research has been conducted into a high-electron mobility transistor (hereinafter, HEMT).

A HEMT may include semiconductor layers having different electrical polarization characteristics. In a HEMT, a semiconductor layer having a relatively high polarizability may cause a 2-dimensional electron gas (hereinafter, 2DEG) in another semiconductor layer that form a heterojunction with the semiconductor layer having the relatively high polarizability. The 2DEG may be used as a channel between drain and source electrodes, and a current flowing through the channel may be controlled by a bias voltage applied to a gate electrode.

A HEMT using a heterojunction formed of a Group III nitride semiconductor may have normally-on characteristics. To turn off the HEMT having the normally-on characteristics, a minus power source may apply a negative (−) bias voltage to the gate electrode, and an additional circuit may be used to reduce (and/or prevent) the flow of an overcurrent during the application of power.

SUMMARY

Example embodiments relate to a high-electron mobility transistor (HEMT) having normally-off characteristics, which may have stable normally-off characteristics and have a low resistance in an on state.

Example embodiments also relate to a method of manufacturing a HEMT.

Additional aspects will be set forth in the description which follows and, in part, will be apparent from the description, or may be learned by practice of example embodiments.

According to example embodiments, a HEMT includes: a channel layer; a channel supply layer on the channel layer, the channel supply layer having a higher energy bandgap than an energy bandgap of the channel layer; a p-type semiconductor structure on the channel supply layer, the p-type semiconductor structure having an energy bandgap that is different than the energy bandgap of the channel supply layer, the p-type semiconductor structure including a hole injection layer (HIL) on the channel, the HIL being configured to inject holes into at least one of the channel layer and the channel supply layer in an on state, and the p-type semiconductor structure including a depletion forming layer on a portion of the HIL, the depletion forming layer having a different dopant concentration than a dopant concentration of the HIL; a gate electrode on the p-type semiconductor structure, and a source electrode and a drain electrode on at least one of the channel layer and the channel supply layer, the source electrode and the drain being spaced apart from two sides of the gate electrode respectively.

In example embodiments, the dopant concentration of the HIL may be higher than the dopant concentration of the depletion forming layer.

In example embodiments, the dopant concentration of the HIL may be about two to five times higher than the dopant concentration of the depletion forming layer.

In example embodiments, the channel supply layer may include aluminum gallium nitride ($Al_xGa_{1-x}N(0<x<1)$), the HIL may include p-type GaN, and the depletion forming layer may include p-type GaN.

In example embodiments, a thickness of the HIL may be less than a critical thickness with which a depletion region formed by the HIL does not affect the channel layer.

In example embodiments, the HIL may have a thickness of about 20 nm or less.

In example embodiments, the depletion forming layer may have a thickness of about 30 nm to about 150 nm.

In example embodiments, an n-type semiconductor layer may be between the depletion forming layer and the gate electrode.

In example embodiments, the HEMT may further include an etching stop layer between the HIL and the depletion forming layer.

In example embodiments, the etching stop layer may include at least one of an $In_{x1}Ga_{1-x1}N$ layer, an $Al_{x2}Ga_{1-x2}N$ layer, and an $Al_{x3}In_yGa_{1-x3-y}N$ layer, wherein $0<x1<1$, $0<x2<1$, $0<x3<1$, $0<y<1$, and $x3+y<1$.

In example embodiments, the HEMT may further include an n-type semiconductor layer between the depletion forming layer and the gate electrode.

In example embodiments, a shape of the depletion forming layer may correspond to a shape of the gate electrode.

In example embodiments, the source and drain electrodes may contact at least one of the channel layer and the channel supply layer.

According to example embodiments, a method of manufacturing a HEMT includes: forming a channel supply layer on a channel layer, forming a p-type semiconductor structure on the channel supply layer by forming a hole injection layer (HIL) on the channel supply and forming a depletion forming layer on the HIL, the p-type semiconductor structure having an energy bandgap that is different than the energy bandgap of the channel supply layer, the HIL being doped with a p-type dopant, the depletion forming layer being doped with a p-type dopant at a different concentration than a concentration of the p-type dopant in the HIL; forming a gate electrode on the p-type semiconductor structure; forming a source electrode and a drain electrode spaced apart from two sides of the gate electrode, respectively; and patterning a portion of the depletion forming layer using a selective etching process.

In example embodiments, the forming the depletion forming layer may include doping the depletion forming layer so the p-type dopant concentration of the HIL may be higher than the p-type dopant concentration of the depletion forming layer. The p-type dopant concentration of the HIL may be about two to five times as high as the p-type dopant concentration of the depletion forming layer.

In example embodiments, the forming the channel supply layer may including forming the channel supply layer of $Al_xGa_{1-x}N$, where (0<x<1), the forming the HIL may include forming the HIL of p-type GaN, and the forming the depletion forming layer may include forming the depletion forming layer of p-type GaN.

In example embodiments, the method may further include forming an etching stop layer on the HIL before forming the depletion forming layer. The etching stop layer may include at least one of an $In_{x1}Ga_{1-x1}N$ layer, an $Al_{x2}Ga_{1-x2}N$ layer, and an $Al_{x3}In_yGa_{1-x3-y}N$ layer, wherein 0<x1<1, 0<x2<1, 0<x3<1, 0<y<1, and x3+y<1.

In example embodiments, the method may further include forming an n-type semiconductor layer on the depletion forming layer before forming the gate electrode.

In example embodiments, the patterning the portion of the depletion forming layer may include forming a remaining portion of the depletion forming layer in a shape corresponding to the gate electrode.

In example embodiments, the forming the source and drain electrodes may include forming the source and drain electrodes on at least one of the channel layer and the channel supply layer.

In example embodiments, a HEMT may have normally-off characteristics because p-type semiconductor is between the channel supply layer and the gate electrode.

The p-type semiconductor structure may cover below even side of the gate electrode, so that an on resistance can be reduced and current collapse can be reduced (and/or prevented).

The p-type semiconductor structure may include a plurality of semiconductor layers having different dopant concentrations, so that an on resistance may be reduced and a drop in threshold voltage may be reduced (and/or minimized).

According to example embodiments, a high-electron mobility transistor includes: a channel layer; a channel supply layer on the channel layer, the channel supply layer being configured to form a two-dimensional electron gas (2DEG) in the channel layer; a source electrode and a drain electrode spaced apart from each other on at least one of the channel layer and the channel supply layer; a gate electrode on a portion of the channel supply layer that is between the source electrode and the drain electrode; a hole injection layer (HIL) between the gate electrode and the channel supply layer, the HIL being configured to inject holes into at least one of the channel layer and the channel supply layer in an on state; a depletion forming layer between the gate electrode and the HIL, the depletion forming layer configured to form a depletion region in the 2DEG, the depletion forming layer having a different dopant concentration than a dopant concentration of the HIL; and at least one of an n-type semiconductor layer and an etching stop layer, the n-type semiconductor layer between the depletion forming layer and the gate electrode, and the etching stop layer being the HIL and the depletion forming layer.

In example embodiments, the HIL and the depletion forming are p-type group III-V nitride semiconductor compounds, and the dopant concentration of the HIL is about two to five times higher than the dopant concentration of the depletion forming layer.

In example embodiments, the channel supply layer may include aluminum gallium nitride ($Al_xGa_{1-x}N$, where (0<x<1)), the HIL may include p-type GaN, and the depletion forming layer may include p-type GaN.

In example embodiments, the at least one of the n-type semiconductor layer and the etching stop layer may include the n-type semiconductor layer.

In example embodiments, the at least one of the n-type semiconductor layer and the etching stop layer may include the etching stop layer.

BRIEF DESCRIPTION OF THE DRAWINGS

These and/or other aspects will become apparent and more readily appreciated from the following description of non-limiting embodiments, as illustrated in the accompanying drawings, in which like reference characters refer to the same parts throughout the different views. The drawings are not necessarily to scale, emphasis instead being placed upon illustrating the principles of example embodiments. In the drawings.

DETAILED DESCRIPTION

Figure 1:
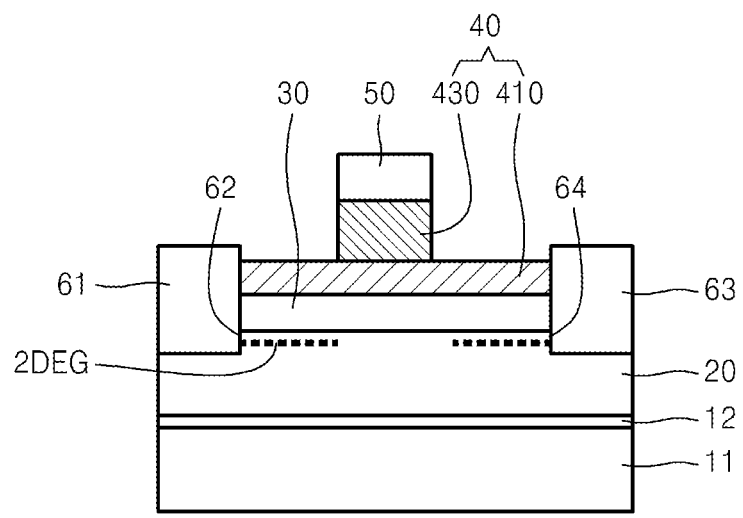
FIG. 1 is a schematic cross-sectional view of a high-electron mobility transistor (HEMT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a HEMT according to example embodiments.

Referring to FIG. 1, a HEMT according to example embodiments may include a substrate 11, a buffer layer 12, a channel layer 20, a channel supply layer 30, a p-type semiconductor structure 40, a gate electrode 50, a source electrode 61, and a drain electrode 63.

The substrate 11 may be formed of, for example, sapphire, silicon (Si), silicon carbide (SiC), or gallium nitride (GaN), but example embodiments are not limited thereto.

Figure 2:
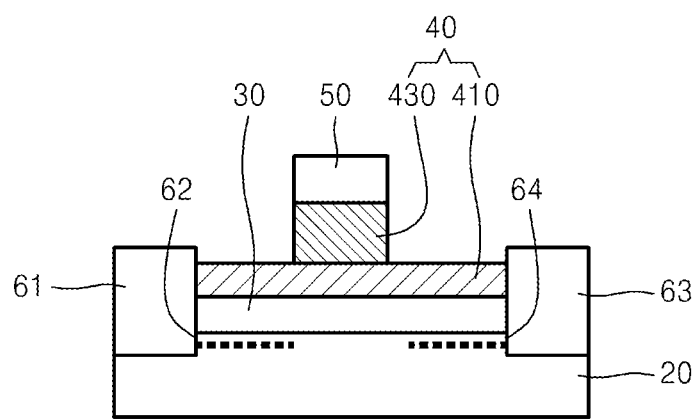
FIG. 2 is a schematic cross-sectional view of the HEMT of FIG. 1, from which a substrate and a buffer layer are removed.

The buffer layer 12 may be provided on the substrate 11. The buffer layer 12 may be formed to reduce differences in lattice constant and coefficient of thermal expansion between the substrate 11 and the channel layer 20 and limit (and/or prevent) degradation of crystallinity of the channel layer 20. The buffer layer 12 may include a single layer or multilayered structure including at least one material selected out of nitrides containing at least one of aluminum (Al), gallium (Ga), indium (In), and boron (B). For instance, the buffer layer 12 may be formed of $Al_xIn_yGa_{1-x-y}N$ ($0 \le x \le 1$, $0 \le y \le 1$ and $x+y \le 1$). In an example, the buffer layer 12 may have a single layer or multilayered structure containing at least one of various materials, such as aluminum nitride (AlN), gallium nitride (GaN), aluminum gallium nitride (AlGaN), indium gallium nitride (InGaN), aluminum indium nitride (AlInN), or aluminum gallium indium nitride (AlGaInN). In some cases, a predetermined seed layer (not shown) may be further provided between the substrate 11 and the buffer layer 12. The seed layer may be a base layer required to grow the buffer layer 12. The substrate 11 and the buffer layer 12 may be removed after manufacturing the HEMT as shown in FIG. 2. In other words, the substrate 11 and the buffer layer 12 may be selectively provided in the HEMT.

Referring back to FIG. 1, a channel layer 20 may be formed on the buffer layer 12. The channel layer 20 may be a layer in which a channel will be formed between the source and drain electrodes 61 and 63. The channel layer 20 may be a single layer or multilayered structure formed of semiconductor. The channel layer 20 may be formed of $Al_xIn_yGa_{1-x-y}N$ ($0 \le x \le 1$, $0 \le y \le 1$, and $x+y \le 1$). For example, the channel layer 20 may include at least one of various materials formed of AlN, GaN, InN, InGaN, AlGaN, AlInN, or AlInGaN. However, the material of the channel layer 20 is not limited thereto and may be any other material in which a 2-dimensional electron gas (2DEG) may be formed. The channel layer 20 may be an undoped layer. However, in some cases, the channel layer 20 may be a doped layer. The channel layer 20 may have a thickness of about several hundred nm or less. For example, the thickness of the channel layer 20 may be about 800 nm or less, about 500 nm or less, and/or about 300 nm or less, but example embodiments are not limited thereto.

A channel supply layer 30 may be formed on the channel layer 20. The channel supply layer 30 may include a material (e.g., semiconductor) having a different energy bandgap from the channel layer 20. For example, the channel supply layer 30 may include a material (e.g., semiconductor) having a larger energy bandgap than the channel layer 20. For instance, the channel supply layer 30 may have a single layer or a multilayered structure including at least one material selected out of nitrides containing at least one of Al, Ga, and In. For example, the channel supply layer 30 may be formed of $Al_xIn_yGa_{1-x-y}N$ ($0 \le x \le 1$, $0 \le y \le 1$, and $x+y \le 1$). In an example, the channel supply layer 30 may have a single layer or multilayered structure including at least one of various materials formed of GaN, InN, AlGaN, AlInN, InGaN, AlN, or AlInGaN. Although the channel supply layer 30 may be an undoped layer, the channel supply layer 30 may be a doped layer according to circumstances. The channel supply layer 30 may have a thickness of several tens of nm or less. For example, the channel supply layer 30 may have a thickness of about 0 to about 50 nm, and/or about 10 to about 40 nm, but example embodiments are not limited thereto.

A 2DEG may be formed in a portion of the channel layer 20. The 2DEG may be formed in a region of the channel layer 20 disposed under an interface between the channel layer 20 and the channel supply layer 30. In other words, the channel supply layer 30 may be configured to form the 2DEG in a portion of the channel layer 20.

Figure 3A:
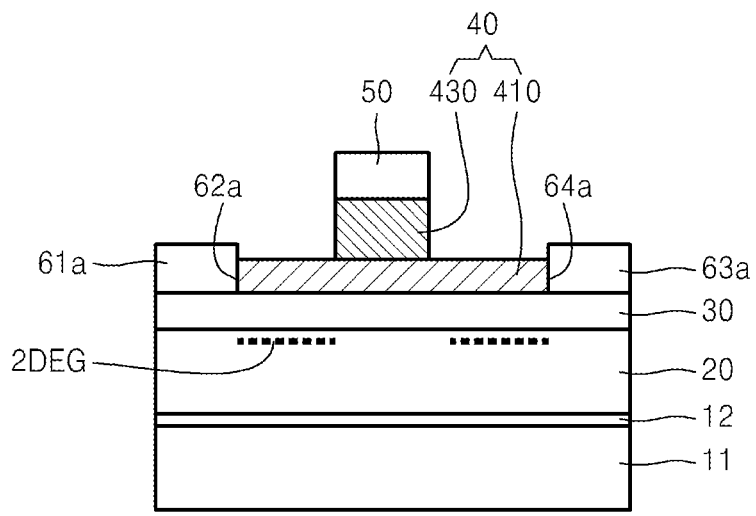
FIGS. 3A and 3B illustrate modified examples of the HEMT of FIG. 1 according to example embodiments, in which the disposition of source and drain electrodes is modified.
Figure 3B:
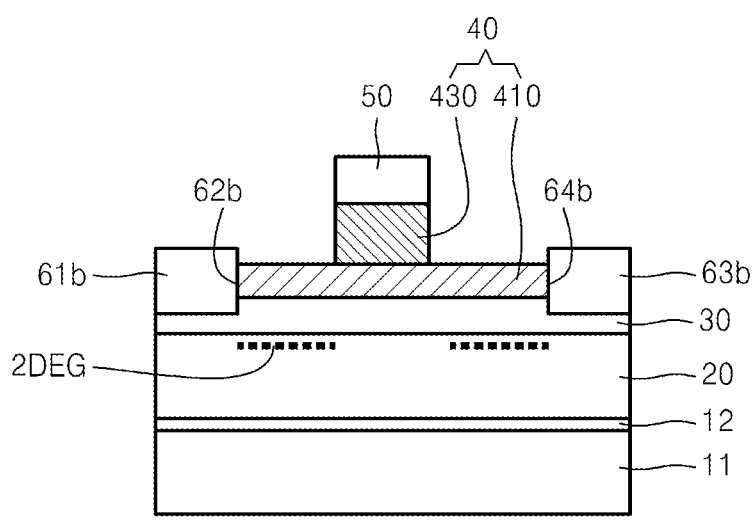

The 2DEG formed in the channel layer 20 may be used as a current path (e.g., channel) between the source and drain electrodes 61 and 63. The source and drain electrodes 63 may be disposed in various ways so that the 2DEG can be used as the channel. In an example, as shown in FIG. 1, after the channel supply layer 30 and the channel layer 20 are partially etched, the source electrode 61 and the drain electrode 63 may be formed in etched regions 62 and 64. In another example, as shown in FIG. 3A, according to example embodiments, a source electrode 61a and a drain electrode 63a may be formed in upper regions 62a and 64a of the channel supply layer 30. Alternatively, as shown in FIG. 3B, according to example embodiments, after the channel supply layer 30 is etched only to a partial thickness, a source electrode 61b and a drain electrode 63b may be formed in etched regions 62b and 64b. The source electrode 61, 61a, or 61b and the drain electrode 63, 63a, or 63b may be in ohmic contact with the channel layer 20 or the channel supply layer Referring back to FIG. 1, the gate electrode 50 may control current flowing between the source and drain electrodes 61 and 63. The source and drain electrodes 61 and 63 may be disposed apart from each other, and the gate electrode 50 may be disposed between the source and drain electrodes 61 and 63. The gate electrode 50 may be disposed closer to the source electrode 61 than to the drain electrode 63.

The p-type semiconductor structure 40 may be formed on the channel supply layer 30. The p-type semiconductor structure 40 may have a different energy bandgap from the channel supply layer 30. The p-type semiconductor structure 40 may include a hole injection layer (HIL) 410 formed on the channel supply layer 30 and a depletion forming layer 430 formed on a portion of the HIL 410.

The HIL 410 may be formed on the channel supply layer 30 and inject holes into at least one of the channel layer 20 and the channel supply layer 30 in an on state. By injecting holes, the concentration of the 2DEG formed in the channel layer 20 may increase so that an on resistance can be reduced. Here, the on state refers to a state in which a desired (and/or alternatively predetermined) bias voltage is applied to the gate electrode 50, and the on resistance refers to a resistance between the source and drain electrodes 61 and 63 in the on state. The HIL 410 may be formed of a p-type semiconductor, for example, $Al_xIn_yGa_{1-x-y}N (0 \le x \le 1, 0 \le y \le 1,$ and $x+y \le 1)$. For instance, the HIL 410 may include at least one of AlN, GaN, AlGaN, InN, AlInN, InGaN, and AlInGaN and be doped with a p-type dopant, such as magnesium (Mg).

The HIL 410 formed on the channel supply layer 30 may protect a top surface of the channel supply layer 30. When the HIL 410 is not formed on the channel supply layer 30, the depletion forming layer 430 may be directly formed on the channel supply layer 30. During the formation of the depletion forming layer 430, the top surface of the channel supply layer 30 may be damaged. For example, when an etching process is performed during the formation of the depletion forming layer 430, the top surface of the channel supply layer 30 may be directly exposed to an etchant and damaged. As a result, surface trap (which refers to the trapping of electrons in the top surface of the channel supply layer 30) may increase in the on state, thus resulting in current collapse. However, in example embodiments, the HIL 410 may be formed on the channel supply layer 30 so that the top surface of the channel supply layer 30 can be limited (and/or prevented) from being damaged during the formation of the depletion forming layer 430. Thus, current collapse may be reduced (and/or minimized). Here, current collapse refers to a phenomenon where an on resistance increases with a rise in a voltage applied to the drain electrode 63.

The HIL 410 may have a different energy bandgap from the channel supply layer 30. Thus, a barrier may be formed due to a difference in bandgap between the HIL 410 and the channel supply layer 30 so that leakage of current from the HIL 410 to the channel supply layer 30 can be reduced (and/or prevented). For example, when the channel supply layer 30 is formed of AlGaN, the HIL 410 may be formed of p-GaN. However, the material of the HIL 410 is not limited to p-GaN and may be formed of any other p-type semiconductor having a different energy bandgap from the channel supply layer 30.

The depletion forming layer 430 may be formed under the gate electrode 50 and embody normally-off characteristics. The normally-off characteristics refer to entering into an off state when no voltage is applied to the gate electrode 50 (e.g., when the gate electrode 50 is in a normal state) and entering into an on state when a voltage is applied to the gate electrode 50.

The depletion forming layer 430, which may be formed of a p-type semiconductor, may serve to form a depletion region in the 2DEG formed in the channel layer 20. An energy band level of a portion of the channel supply layer 30 disposed under the depletion forming layer 430 may be increased by the depletion forming layer 430. As a result, the depletion region may be formed in the 2DEG formed in the channel layer 20 corresponding to the depletion forming layer 430. As a result, a 2DEG may not be formed in a region corresponding to the depletion forming layer 430, or the region corresponding to the depletion forming layer 430 may have different characteristics (e.g., electron concentration) from the remaining region. In other words, the depletion forming layer 430 may be configured to form the depletion region in the 2DEG.

The depletion forming layer 430 may be formed of a p-type semiconductor, for example, $Al_xIn_yGa_{1-x-y}N (0 \le x \le 1, 0 \le y \le 1,$ and $x+y \le 1)$. For example, the depletion forming layer 430 may include at least one of AlN, GaN, AlGaN, InN, AlInN, InGaN, and AlInGaN, and the depletion forming layer 430 may be doped with a p-type dopant, such as Mg. For example, the depletion forming layer 430 may be a p-GaN layer or a p-AlGaN layer.

The depletion forming layer 430 may have a shape corresponding to the gate electrode 50. To this end, the depletion forming layer 430 may be patterned in various ways. In an example, the depletion forming layer 430 may selectively remove the remaining region, except for a gate forming region, using an etching process. For example, a dry etching process may be used as the etching process. An etching gas may be, for example, chlorine ($Cl_2$) gas and/or boron chloride ($BCl_3$) gas. As a result, the depletion forming layer 430 may be formed under the gate electrode 50 but not on side surfaces of the gate electrode 50.

The depletion forming layer 430 may have a thickness of about 30 nm to about 150 nm. When the depletion forming layer 430 has a thickness of less than about 30 nm, the depletion region may not be formed in the 2DEG of the channel layer 20 so that normally-on characteristics may happen. That is, current may flow in an off state. Meanwhile, when the depletion forming layer 430 has a thickness of more than about 150 nm, an energy bandgap of the portion of the channel supply layer 30 disposed under the depletion forming layer 430 may be excessively increased by the depletion forming layer 430 so that a bias voltage applied to the gate electrode 50 to enter into an on state can be excessively increased.

The HIL 410 may have a different dopant concentration from the depletion forming layer 430. In an example, the HIL 410 may have a higher dopant concentration than the depletion forming layer 430. The dopant of the HIL 410 may be about twice to five times as high as the dopant concentration of the depletion forming layer 430. For example, when the depletion forming layer 430 is doped with Mg at a dopant concentration of about $2 \times 10^{19}$ cm$^{-3}$, the HIL 410 may be doped with Mg at a dopant concentration of about $4 \times 10^{19}$ cm$^{-3}$ to about $10 \times 10^{19}$ cm$^{-3}$. Since the HIL 410 has a high dopant concentration, the efficiency of holes injected into the channel layer 20 and/or the channel supply layer 30 may be improved in an on state. By improving the hole injection efficiency, the concentration of the 2DEG in the channel layer 20 may be increased so that an on resistance of the channel can be reduced. When the dopant concentration of the depletion forming layer 430 is as high as that of the HIL 410, a threshold voltage may be reduced so that stable normally-off characteristics are impaired. However, in example embodiments, by increasing only the dopant concentration of the HIL 410, a reduction in threshold voltage may be reduced (and/or minimized), and the on resistance may be reduced.

Meanwhile, during the formation of the HIL 410 on the channel supply layer 30, it could be seen that the HIL 410 was doped at a dopant concentration lower than an intended concentration during an initial period of the growth of the HIL 410. Accordingly, when the dopant concentration of the HIL 410 was adjusted to be equal to that of the depletion forming layer 430, the dopant concentration of the HIL 410 became lower than the dopant concentration of the depletion forming layer 430. As a result, the hole injection efficiency was reduced, so a desired reduction in on resistance could not be attained. However, in example embodiments, since the dopant concentration of the HIL 410 may be adjusted to be higher than that of the depletion forming layer 430, a drop in the dopant concentration may be reduced (and/or prevented) during the initial period of the formation of the HIL 410, and the on resistance may be reduced.

The HIL 410 may have a thickness equal to or less than a critical thickness with which the depletion region formed by the HIL 410 does not affect the 2DEG formed in the channel layer 20. In an example, the HIL 410 may have a thickness of about 20 nm or less. When the HIL 410 has a thickness of more than about 20 nm, the depletion region formed under the HIL 410 may affect the 2DEG formed in the channel layer 20 so that the on resistance may increase.

In summary, the HIL 410 may have a dopant concentration higher than the dopant concentration of the depletion forming layer 430, so the hole injection efficiency may increase and a reduction in threshold voltage may be reduced (and/or minimized). In this case, since the HIL 410 is formed of a p-type semiconductor, the depletion region may be formed under the HIL 410. The thickness of the HIL 410 may be within such a range as to limit (and/or prevent) the depletion region from affecting the 2DEG formed in the channel layer 20. Also, since the HIL 410 has a different energy bandgap from the channel supply layer 30, leakage of current from the gate electrode 50 into the channel supply layer 30 may be cut off.

Figure 4:
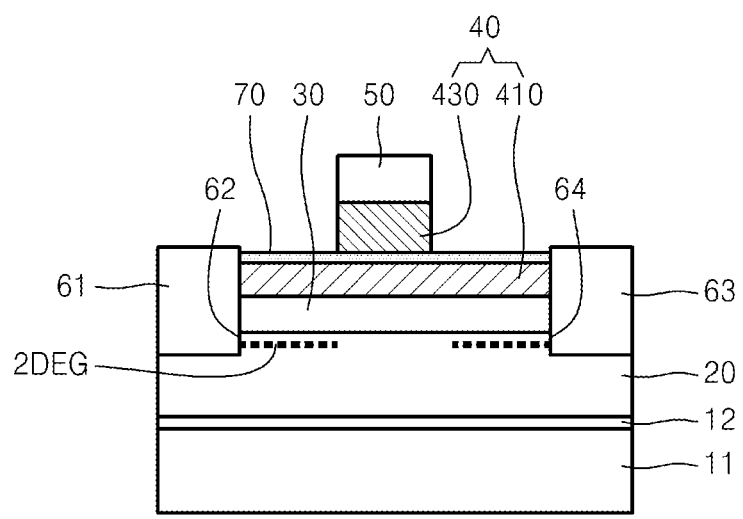
FIG. 4 is a schematic cross-sectional view of a HEMT according to example embodiments.

FIG. 4 is a cross-sectional view of a HEMT according to example embodiments.

Referring to FIG. 4, a HEMT according to example embodiments may further include an etching stop layer 70 formed between an HIL 410 and a depletion forming layer 430. In FIG. 4, the same numerals are used to denote the same elements as in FIG. 1, and a repeated description thereof is omitted.

During the etching process for patterning the depletion forming layer 430, the etching stop layer 70 may limit (and/or prevent) unnecessary etching of other layers disposed thereunder. The etching stop layer 70 may have a lower etch rate than the depletion forming layer 430. The etching stop layer 70 may be formed of at least one material layer of an $In_{x1}Ga_{1-x1}N$ layer, an $Al_{x2}Ga_{1-x2}N$ layer, and an $Al_{x3}In_yGa_{1-x3-y}N$ layer ($0<x1<1$, $0<x2<1$, $0<x3<1$, $0<y<1$, and $x3+y<1$). For example, the etching stop layer 70 may be at least one of an InGaN layer, an AlGaN layer, and an AlInGaN layer.

The substrate 11 and the buffer layer 12 may be removed after manufacturing the HEMT shown in FIG. 4.

Figure 5:
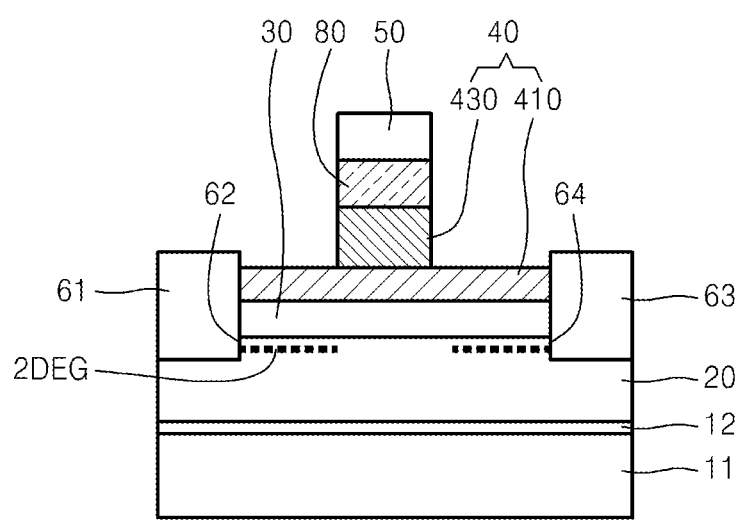
FIGS. 5 and 6 are schematic cross-sectional views of a HEMT according to example embodiments.
Figure 6:
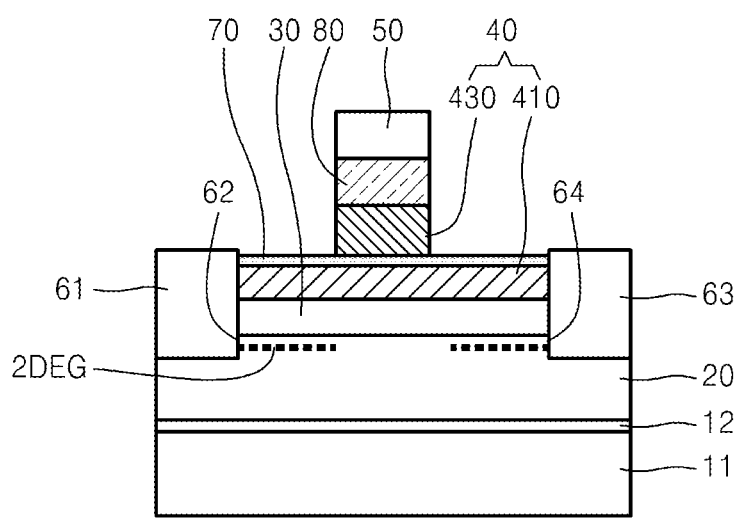

FIGS. 5 and 6 are cross-sectional views of a HEMT according to example embodiments. Referring to FIGS. 5 and 6, a HEMT according to example embodiments may further include an n-type semiconductor layer 80 formed between a gate electrode 50 and a depletion forming layer 430. In FIGS. 5 and 6, the same numerals are used to denote the same elements as in FIGS. 1 and 4, and a repeated description thereof is omitted.

The n-type semiconductor layer 80 may be disposed between the gate electrode 50 and the depletion forming layer 430 and reduce (and/or prevent) leakage of current from the gate electrode 50 to the depletion forming layer 430. The n-type semiconductor layer 80 may be formed of $Al_xIn_yGa_{1-x-y}N$ ($0 \leq x \leq 1$, $0 \leq y \leq 1$, and $x+y \leq 1$). For example, the n-type semiconductor layer 80 may include at least one of AlN, GaN, AlGaN, InN, AlInN, InGaN, and AlInGaN and be doped with an n-type dopant, such as silicon (Si). For example, the n-type semiconductor layer 80 may be an n-GaN layer or an n-AlGaN layer.

Leakage of current from the gate electrode 50 to the channel supply 30 may be primarily cut off by the n-type semiconductor layer 80 formed under the gate electrode 50 and secondarily cut off by the HIL 410 having a different energy bandgap from the channel supply layer 30.

As shown in FIGS. 5-6, in HEMTs according to example embodiments, one n-type semiconductor layer 80 and one depletion forming layer 430 may be between the gate electrode 50 and the HIL 410. However, example embodiments are not limited thereto. For example, the n-type semiconductor layer 80 and/or the depletion forming layer 430 may be a multilayer structure, or an intervening layer may be between the gate electrode 50 and the n-type semiconductor layer 80.

While FIGS. 4-6 illustrate HEMTs according to example embodiments with source and drain electrodes 61 and 63 on etched regions of the channel layer 20, example embodiments are not limited thereto. For example, the source and drain electrodes 61 and 63 in FIGS. 4-6 may be modified so they are formed on the channel supply layer 30, just as the source and drain electrodes 61a and 63a are shown in FIG. 3A. Alternatively, the source and drain electrodes 61 and 63 in FIGS. 4-6 may be modified so they are formed on etched portions of the channel supply layer 30, just as the source and drain electrodes 61b and 63b in FIG. 3B are shown.

FIGS. 7A through 7G are cross-sectional views illustrating a method of manufacturing the HEMT of FIG. 1.

Figure 7A:
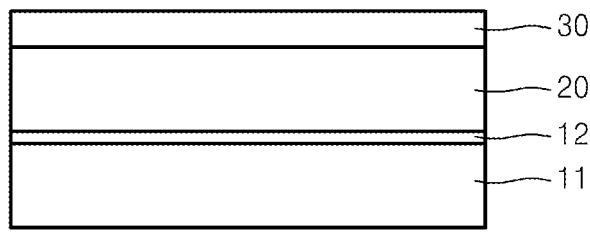
FIGS. 7A through 7G are cross-sectional views illustrating a method of manufacturing the HEMT of FIG. 1.

Referring to FIG. 7A, a buffer layer 12, a channel layer 20, and a channel supply layer 30 may be sequentially formed on a substrate 11.

The substrate 11 may be formed of, for example, sapphire, silicon, silicon carbide (SiC), or gallium nitride (GaN). The buffer layer 12 may be formed on the substrate 11. The buffer layer 12 may be formed to reduce differences in lattice constant and coefficient of thermal expansion between the substrate 11 and the channel layer 20 and reduce (and/or prevent) degradation of crystallinity of the channel layer 20. The buffer layer 12 may have a single layer or multilayered structure including at least one material selected out of nitrides containing at least one of Al, Ga, In, and B. In an example, the buffer layer 12 may have a single layer or multilayered structure including at least one of various materials formed of AlN, GaN, InN, AlGaN, InGaN, AlInN, and AlGaInN. In some cases, a desired (and/or alternatively predetermined) seed layer (not shown) may be further formed between the substrate 11 and the buffer layer 12. The seed layer may be a base layer required to grow the buffer layer 12.

The channel layer 20 may be formed on the buffer layer 12. The channel layer 20 may be a layer in which a channel is formed between source and drain electrodes 61 and 63. The channel layer 20 may be a semiconductor layer. For example, the channel layer 20 may include at least one of various materials formed of AlN, GaN, InN, AlInN, InGaN, AlGaInN, or AlGaN. Although the channel layer 20 may be an undoped layer, the channel layer 20 may be a doped layer according to circumstances. The channel layer 20 may have a thickness of about several hundred nm or less.

The channel supply layer 30 may be formed on the channel layer 20. The channel supply layer 30 may be formed of a different semiconductor from the channel layer 20. An epitaxial growth process may be used to form the channel supply layer 30 on the channel layer 20. The channel supply layer 30 may be formed of a material (e.g., a semiconductor) having a different energy bandgap from the channel layer 20. For example, the channel supply layer 30 may be formed of a material (e.g., a semiconductor) having a higher energy bandgap than the channel layer 20. For instance, the channel supply layer 30 may have a single layer or multilayered structure including at least one selected of nitrides containing at least one of Al, Ga, and In. For example, the channel supply layer 30 may have a single layer or multilayered structure including at least one of various materials formed of GaN, InN, AlGaN, AlInN, InGaN, AlN, and AlInGaN. Although the channel supply layer 30 may be an undoped layer, the channel supply layer 30 may be a layer doped with a desired (and/or alternatively predetermined) dopant according to circumstances.

Figure 7B:
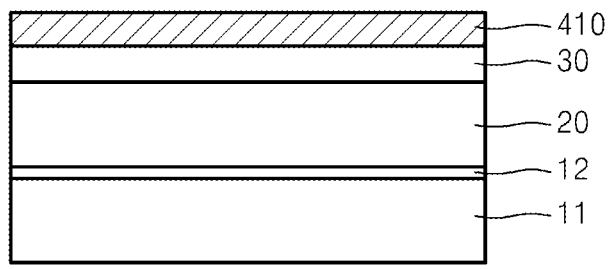

Referring to FIG. 7B, a HIL 410 may be formed on the channel supply layer 30. The HIL 410 may be formed of a p-type semiconductor and configured to inject holes into at least one of the channel layer 20 and the channel supply layer 30. In an example, the HIL 410 may include at least one of GaN, AlGaN, InN, AlInN, InGaN, and AlInGaN and doped with a p-type dopant, such as magnesium (Mg). The HIL 410 may be doped with a p-type dopant at a desired (and/or alternatively predetermined) concentration. For example, the HIL 410 may be doped with Mg at a concentration of about $4 \times 10^{19}$ cm$^{-3}$ to about $10 \times 10^{19}$ cm$^{-3}$. Although not shown in the drawings, an undoped GaN layer, an undoped AlN layer, an undoped InN layer, an undoped InGaN layer, an undoped AlGaN layer or an undoped InAlGaN layer may be inserted between the HIL 410 and the channel supply layer 30 as needed.

The HIL 410 may have a different energy bandgap from the channel supply layer 30 so that leakage of current form the HIL 410 to the channel supply layer 30 can be reduced (and/or prevented). For example, when the channel supply layer 30 is formed of AlGaN, the HIL 410 may be formed of p-GaN having a different energy bandgap from AlGaN. However, the material of the HIL 410 is not limited to p-GaN and may be any other p-type semiconductor having a different energy bandgap from the channel supply layer 30.

The HIL 410 may have a thickness equal to or less than a critical thickness with which the depletion region formed by the HIL 410 does not affect the 2DEG formed in the channel layer 20. In an example, the HIL 410 may have a thickness of about 20 nm or less. When the HIL 410 has a thickness of more than about 20 nm, the depletion region formed under the HIL 410 may affect the 2DEG formed in the channel layer 20, thereby increasing an on resistance.

Figure 7C:
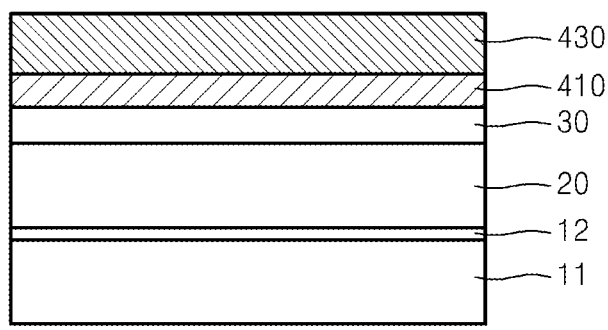

Referring to FIG. 7C, a depletion forming layer 430 may be formed on the HIL 410. The depletion forming layer 430 may include at least one p-type semiconductor out of AlN, GaN, AlGaN, InN, AlInN, InGaN, and AlInGaN and doped with a p-type dopant, such as Mg. For example, the depletion forming layer 430 may be a p-GaN layer or a p-AlGaN layer.

The depletion forming layer 430 may be doped with a p-type dopant at a different concentration from the HIL 410. For instance, the HIL 410 may have a higher dopant concentration than the depletion forming layer 430. The dopant concentration of the HIL 410 may be about twice to five times as high as the dopant concentration of the depletion forming layer 430. For example, when the depletion forming layer 430 is doped with Mg at a concentration of about $2 \times 10^{19}$ cm$^{-3}$, the HIL 410 may be doped with Mg at a concentration of about $4 \times 10^{19}$ cm$^{-3}$ to about $10 \times 10^{19}$ cm$^{-3}$.

Figure 7D:
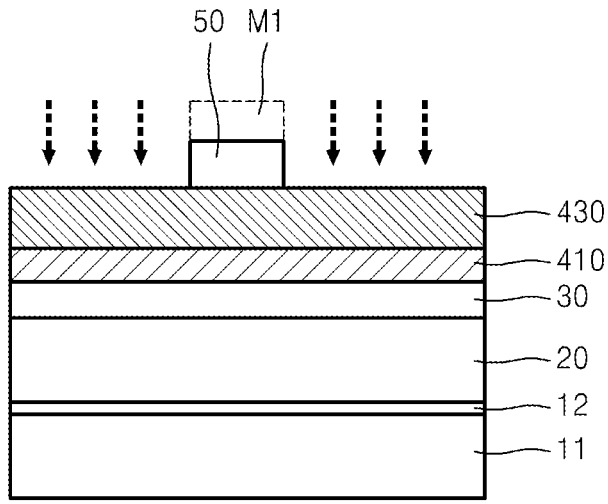

Referring to FIG. 7D, a gate electrode 50 may be formed on the depletion forming layer 430. To form the gate electrode 50 having a desired (and/or alternatively predetermined) shape, the gate electrode 50 may be formed on the entire depletion forming layer 430. Next, an exposed portion of the gate electrode 50 may be selectively removed using a first mask layer M1 as an etch mask to form the gate electrode 50 having the desired (and/or alternatively predetermined) shape shown in FIG. 7D. In this case, a fluorine (F)-containing gas may be used as an etchant for the gate electrode 50. Although not shown, an undoped GaN layer, an undoped AlN layer, an undoped InN layer, an undoped InGaN layer, an undoped AlGaN layer or an undoped InAlGaN layer may be inserted between the depletion forming layer 430 and the gate electrode 50 as needed.

Figure 7E:
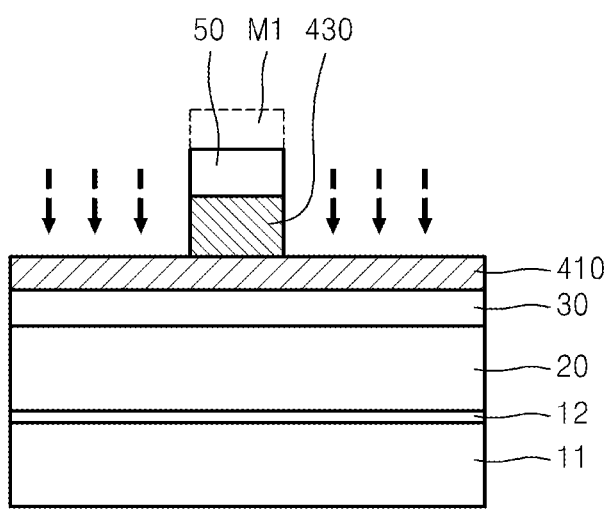

Referring to FIG. 7E, a portion of the depletion forming layer 430 may be patterned using a selective etching process. An exposed region of the depletion forming layer 430 may be etched using the first mask layer M1 until the HIL 410 is exposed. As a result, the patterned depletion forming layer 430 may have a shape corresponding to the gate electrode 50. The depletion forming layer 430 may be formed under the gate electrode 50 but not on side surfaces of the gate electrode 50. For example, a dry etching process may be used as the etching process. An etching gas may be, for example, chlorine gas and/or boron chloride gas. In this case, the HIL 410 may limit (and/or prevent) damage to a top surface of the channel supply layer 30. This is because the HIL 410 is interposed between the channel supply layer 30 and the depletion forming layer 430 and limits (and/or prevents) the channel supply layer 30 from being directly exposed to the etchant during the etching process. When the HIL 410 is not formed on the channel supply layer 30, the top surface of the channel supply layer 30 may be in direct contact with the etchant during the patterning of the depletion forming layer 430 so that the top surface of the channel supply layer 30 may be damaged. As a result, surface trap may increase in the top surface of the channel supply layer 30 in an on state, thus resulting in current collapse. However, since the HIL 410 may be formed on the channel supply layer 30, damage to the top surface of the channel supply layer 30 may be limited (and/or prevented) during the formation of the depletion forming layer 430. As a result, the current collapse may be reduced (and/or minimized).

The etching process may be performed using the same mask M1 as in the formation of the gate electrode 50. As a result, the number of process operations caused by a change of masks may be reduced.

The depletion forming layer 430 may have a thickness of about 30 nm to about 150 nm. When the depletion forming layer 430 has a thickness of less than about 30 nm, a 2DEG may not be formed in the depletion region or the influence of the depletion forming layer 430 may be very weak. Thus, normally-on characteristics may occur so that current may flow in an off state. Meanwhile, when the depletion forming layer 430 has a thickness of more than about 150 nm, a portion of the channel supply layer 30 disposed under the depletion forming layer 430 may have an excessively high energy bandgap due to the depletion forming layer 430 so that a bias voltage applied to the gate electrode 50 to enter into an on state can be excessively increased.

Figure 7F:
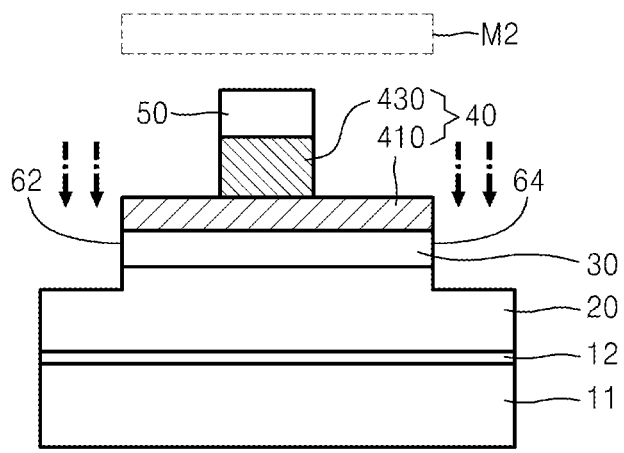

Referring to FIG. 7F, regions in which the source and drain electrodes 61 and 63 will be formed may be etched using a second mask layer M2 as an etch mask. The second mask layer M2 may be different from the first mask layer M1. In an example, regions 62 and 64 in which the source and drain electrodes 61 and 63 will be formed may be formed by etching the HIL 410, the channel supply layer 30, and a portion of the channel layer 20 as shown in FIG. 7F. However, an etching depth is not limited thereto and may be increased or reduced as needed. In another example, regions 62*a*, 62*b*, 64*a*, and 64*b* in which the source and drain electrodes 61 and 63 will be formed may be formed by etching only the HIL 410 as shown in FIG. 3A or etching only partial thicknesses of the HIL 410 and the channel supply layer 30 as shown in FIG. 3B. Although the method according to example embodiments in FIGS. 7A to 7F relates to an example in which the etching of the source and drain electrodes 61 and 63 is performed after forming the gate electrode 50 and the depletion forming layer 430, the order of process operations is not limited thereto and may be changed as needed.

Figure 7G:
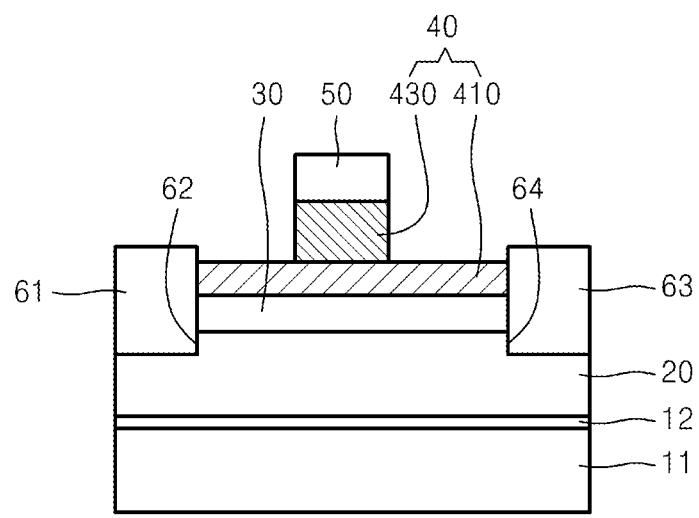

Referring to FIG. 7G, the source and drain electrodes 61 and 63 may be formed in the regions in which the source and drain electrodes 61 and 63 will be formed.

FIGS. 8A through 8H are cross-sectional views illustrating a method of manufacturing the HEMT of FIG. 4. FIGS. 8A through 8H illustrate a method of manufacturing a HEMT including an etching stop layer 70, and the same descriptions as in FIGS. 7A through 7G will be omitted.

Figure 8A:
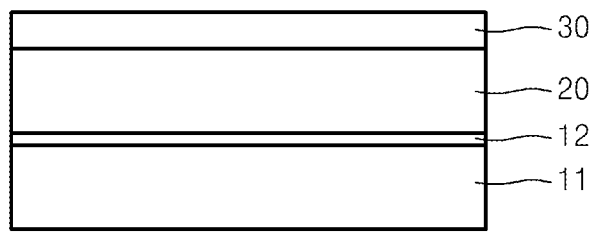
FIGS. 8A through 8H are cross-sectional views illustrating a method of manufacturing the HEMT of FIG. 4.
Figure 8B:
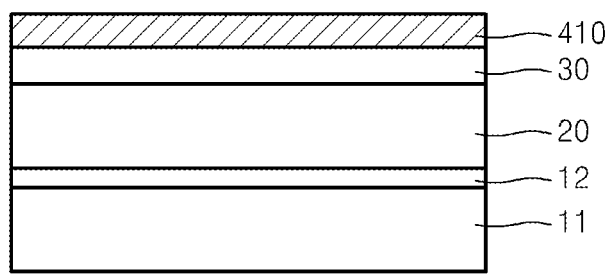
Figure 8C:
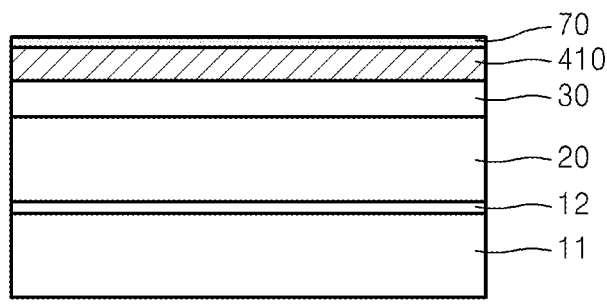
Figure 8D:
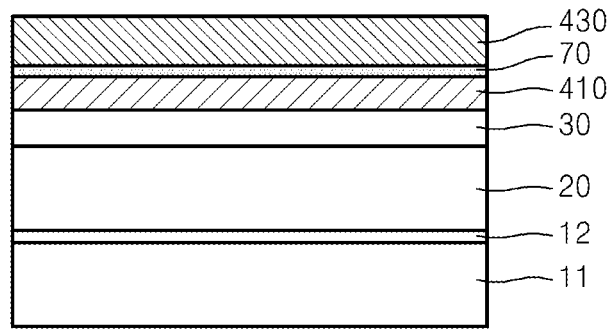
Figure 8E:
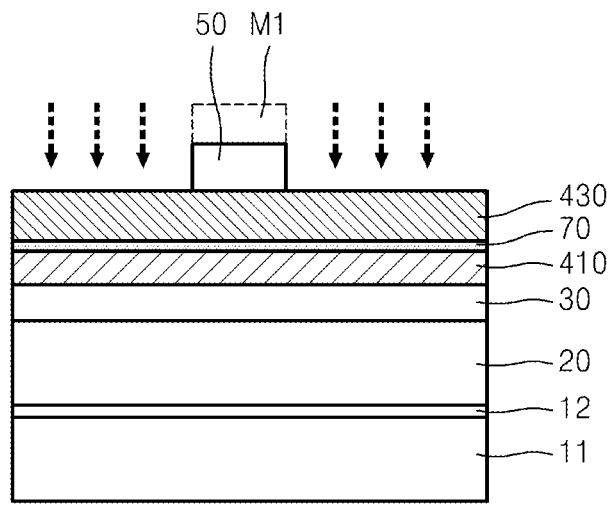
Figure 8F:
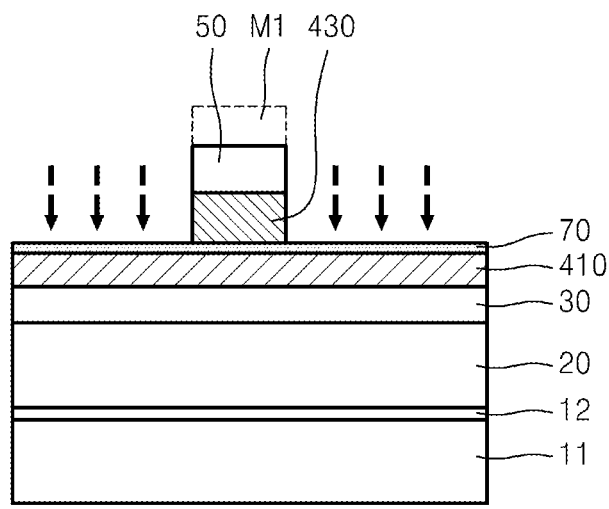
Figure 8G:
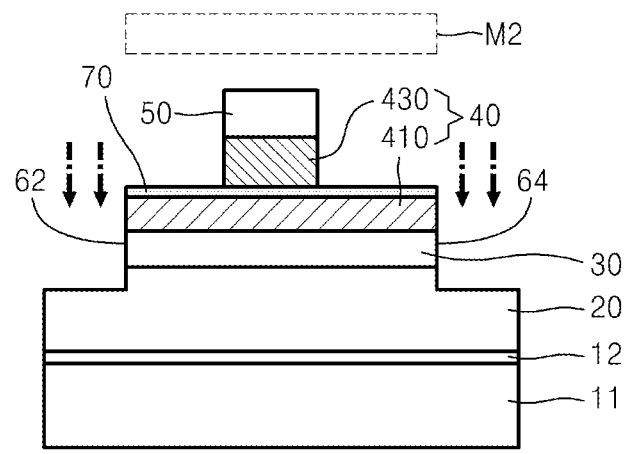
Figure 8H:
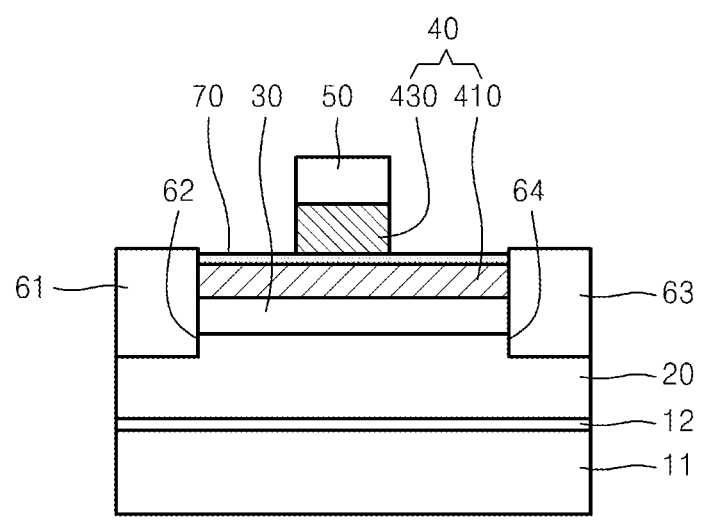

Referring to FIG. 8C, before forming a depletion forming layer (refer to 430 in FIG. 8D), the etching stop layer 70 may be formed on an HIL 410. The etching stop layer 70 may be disposed under the depletion forming layer 430. The etching stop layer 70 may limit (and/or prevent) unnecessary etching of other layers disposed thereunder during the etching of the depletion forming layer 430. In an example, the etching stop layer 70 may include at least one of an InGaN layer, an AlGaN layer, and an AlInGaN layer.

FIGS. 9A through 9H are cross-sectional views illustrating a method of manufacturing the HEMT of FIG. 5. FIGS. 9A through 9H illustrate a method of manufacturing a HEMT further including an n-type semiconductor layer 80. The same descriptions as in FIGS. 7A through 7G will be omitted.

Figure 9A:
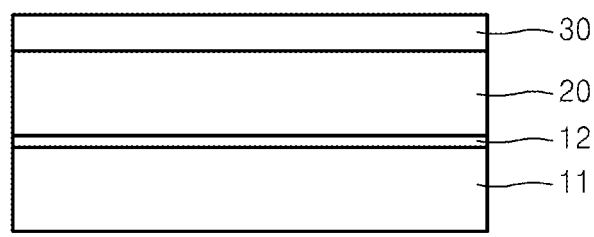
FIGS. 9A through 9H are cross-sectional views illustrating a method of manufacturing the HEMT of FIG. 5.
Figure 9B:
Figure 9C:
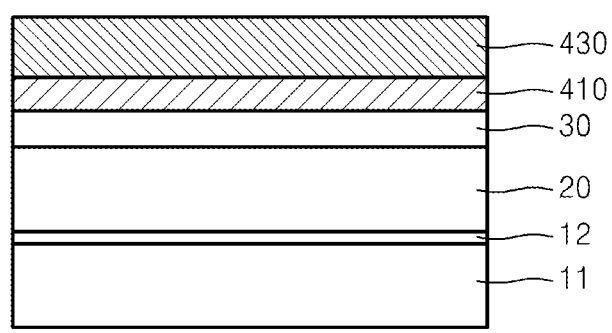
Figure 9D:
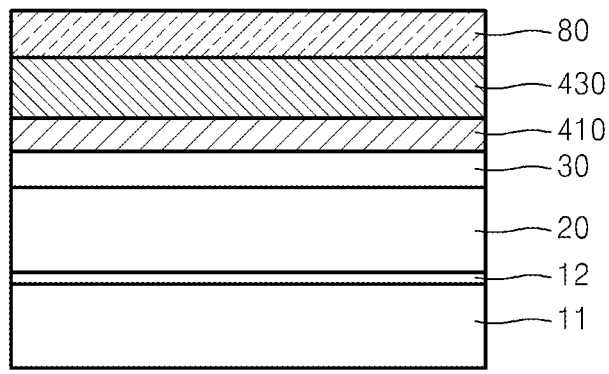

Referring to FIG. 9D, the n-type semiconductor layer 80 may be formed on a depletion forming layer 430. The n-type semiconductor layer 80 may include at least one of GaN and AlGaN and doped with silicon as an n-type dopant.

Figure 9E:
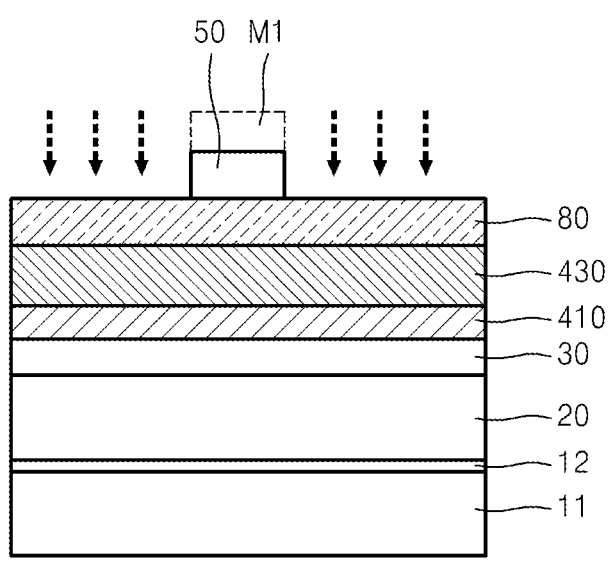
Figure 9F:
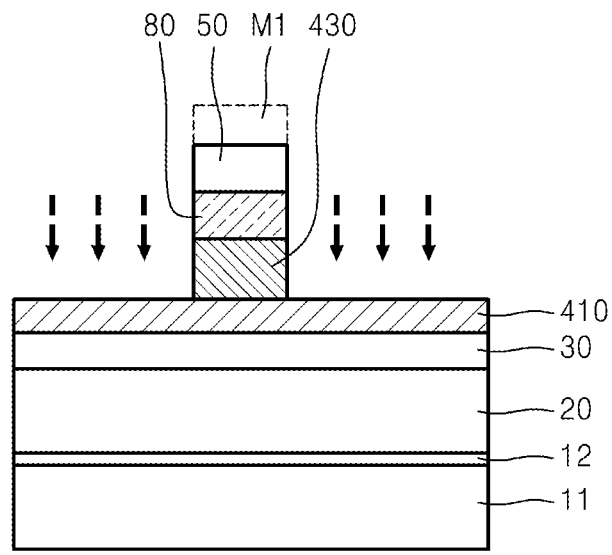
Figure 9G:
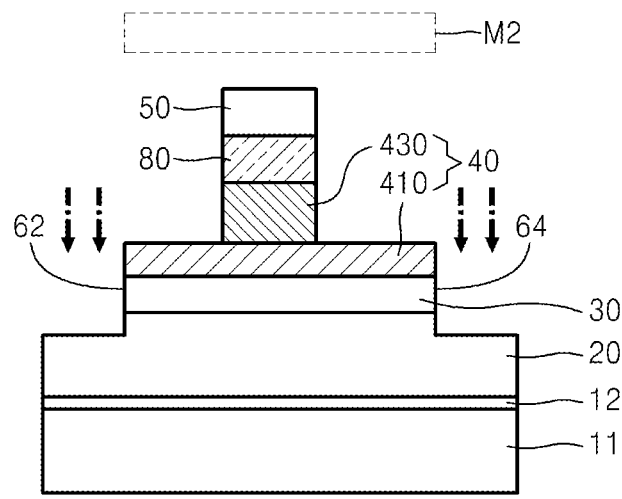
Figure 9H:
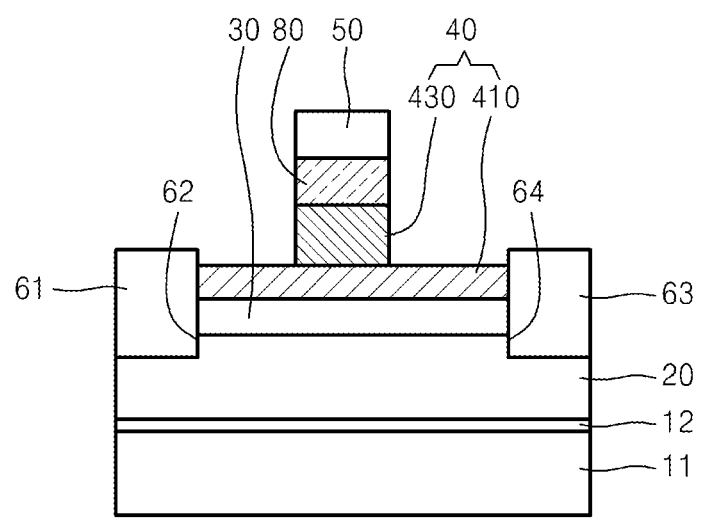

Referring to FIG. 9E, exposed portions of the n-type semiconductor layer 80 and the depletion forming layer 430 may be patterned by etching using a first mask layer M1 as an etch mask. In this case, a dry etching process may be used as an example of the etching process. An etchant may be, for example, chlorine gas and/or boron chloride gas.

The n-type semiconductor layer 80 may be disposed between the depletion forming layer 430 and the gate electrode 50 and reduce (and/or prevent) leakage of current from the gate electrode 50 into the depletion forming layer 430.

The methods described with reference to FIGS. 7A through 7G, 8A through 8H, and 9A through 9H may be variously modified. For example, to manufacture the HEMT of FIG. 5, most processes may be performed with reference to FIGS. 9A through 9H except that the etching stop layer 70 may be formed on the HIL 410 as shown in FIG. 8C before forming the depletion forming layer 430. Thus, an etching process may be precisely controlled during the patterning of the depletion forming layer 430.

FIGS. 10A to 10D are schematic cross-sectional views of HEMTs according to example embodiments. Hereinafter the differences between FIGS. 10A to 10D and FIGS. 1, and 4-6 will be mainly described.

Figure 10A:
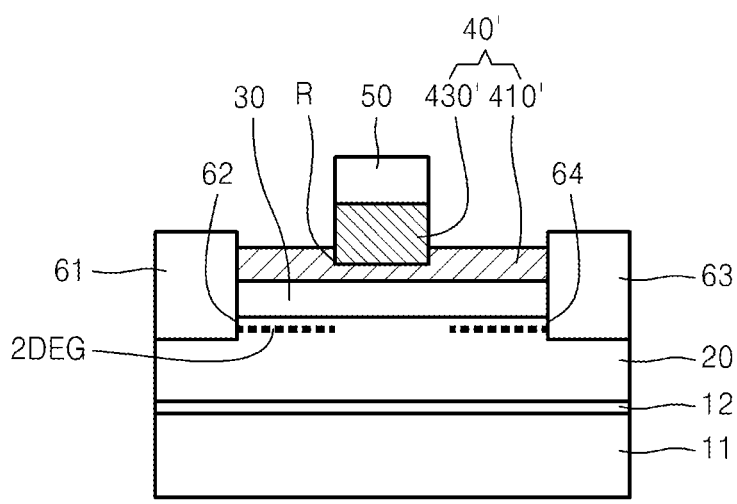
FIGS. 10A to 10D are schematic cross-sectional views of HEMTs according to example embodiments.

Referring to FIG. 10A, a HEMT according to example embodiments may be the same as the HEMT according to example embodiments in FIG. 1 except for the structure of the HIL 410' of the p-type semiconductor structure 40'. In FIG. 10A, an upper surface of the HIL 410' may define a recess R and the depletion forming layer 430' may be formed on the recess R.

Figure 10B:
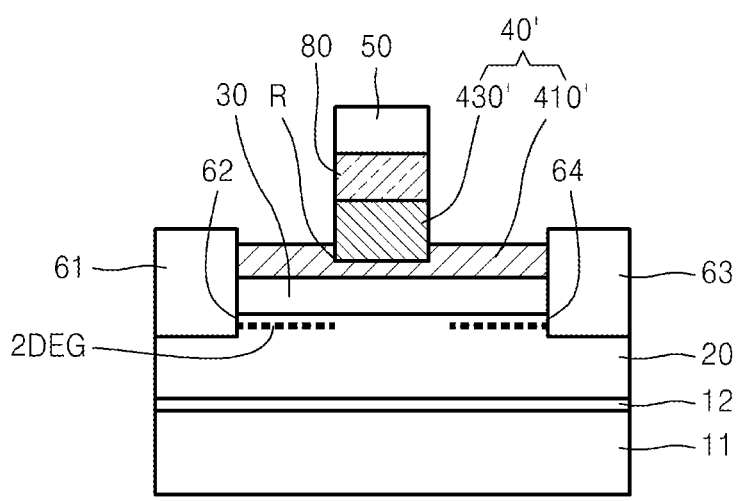

Referring to FIG. 10B, a HEMT according to example embodiments may be the same as the HEMT according to example embodiments in FIG. 5 except for the structure of the HIL 410' of the p-type semiconductor structure 40'. In FIG. 10B, an upper surface of the HIL 410' may define a recess R and the depletion forming layer 430' may be formed on the recess R. An n-type semiconductor layer 80 may be formed between a gate electrode 50 and the depletion forming layer 430'.

Figure 10C:
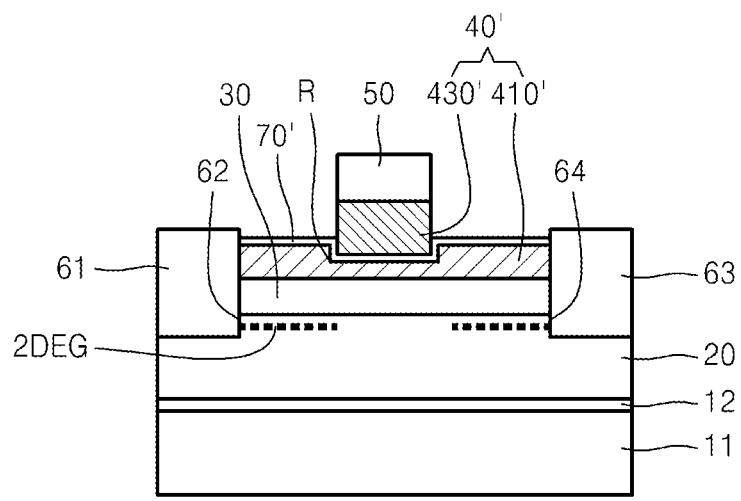

Referring to FIG. 10C, a HEMT according to example embodiments may be the same as the HEMT according to example embodiments in FIG. 4 except for the structure of the HIL 410' of the p-type semiconductor structure 40', and the etching stop layer 70'. In FIG. 10C, an upper surface of the HIL 410' may define a recess R and the etching stop layer 70' may be formed on the recess R. The etching stop layer 70' may conform to a shape of the upper surface of the HIL 410'. The depletion forming layer 430' may be formed on the etching stop layer 70' and the recess R.

Figure 10D:
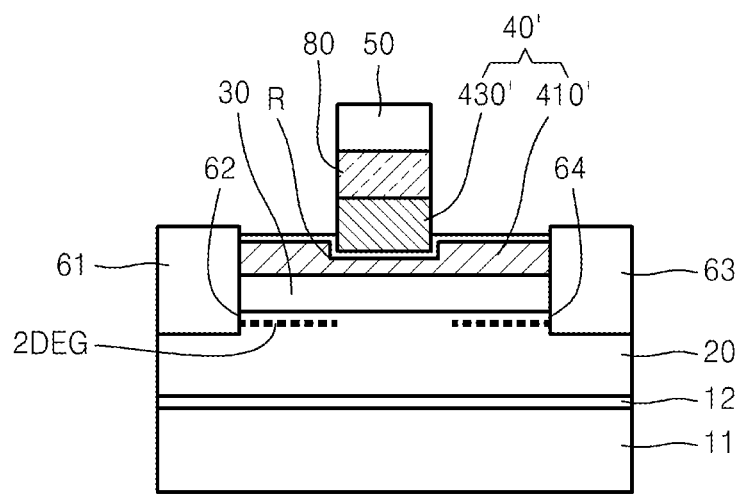

Referring to FIG. 10D, a HEMT according to example embodiments may be the same as the HEMT according to example embodiments in FIG. 10C, except the HEMT according to example embodiments in FIG. 10D may further include an n-type semiconductor layer 80 may between the gate electrode 50 and the depletion forming layer 430'.

HEMTs according to example embodiments may be used as, for example, power devices. However, HEMTs according to example embodiments are not limited to the power devices and may be applied in various fields. For example, HEMTs according to example embodiments may also be used for other purposes, for example, as radio-frequency (RF) switching devices.

Furthermore, another layer may be inserted between respective layers of HEMTs according to example embodiments. For example, an undoped GaN layer, an undoped AlN layer, an undoped InN layer, an undoped InGaN layer, an undoped AlGaN layer, or an undoped InAlGaN layer may be inserted between the HIL 410 and the channel supply layer 30. Also, an undoped GaN layer, an undoped AlN layer, an undoped InN layer, an InGaN layer, an AlGaN layer, or an undoped InAlGaN layer may be inserted between the depletion forming layer 430 and the gate electrode 50.

It should be understood that the exemplary embodiments described herein should be considered in a descriptive sense only and not for purposes of limitation. Descriptions of features or aspects within each HEMT and/or method of manufacturing a HEMT according to example embodiments should be considered as available for other similar features or aspects in other HEMTs and/or methods of manufacturing other HEMTs according to example embodiments. For example, one skilled in the art will know that the shown structures of HEMTs and methods of manufacturing the HEMTs may be variously changed. In addition, one skilled in the art will know that the idea of the present disclosure may be applied to semiconductor devices other than HEMTs.

While some example embodiments have been particularly shown and described, it will be understood by one of ordinary skill in the art that variations in form and detail may be made therein without departing from the spirit and scope of the claims.

What is claimed is:

1. A high-electron mobility transistor (HEMT) comprising:
    a channel layer;
    a channel supply layer on the channel layer,
        the channel supply layer having an energy bandgap that is higher than an energy bandgap of the channel layer;
    a p-type semiconductor structure on the channel supply layer,
        the p-type semiconductor structure having an energy bandgap that is different than the energy bandgap of the channel supply layer,
        the p-type semiconductor structure including a hole injection layer (HIL) on the channel supply layer,
        the HIL being configured to inject holes into at least one of the channel layer and the channel supply layer in an on state, and
        the p-type semiconductor structure including a depletion forming layer on a portion of the HIL,
        the depletion forming layer having a different dopant concentration than a dopant concentration of the HIL;
    a gate electrode on the p-type semiconductor structure; and
    a source electrode and a drain electrode on at least one of the channel layer and the channel supply layer,
        the source electrode and the drain electrode being spaced apart from two sides of the gate electrode respectively, wherein the dopant concentration of the HIL is higher than the dopant concentration of the depletion forming layer.

2. The HEMT of claim 1, wherein the dopant concentration of the HIL is about two to five times higher than the dopant concentration of the depletion forming layer.

3. The HEMT of claim 1, wherein
    the channel supply layer includes aluminum gallium nitride ($Al_xGa_{1-x}N$, where ($0<x<1$)),
    the HIL includes p-type GaN, and
    the depletion forming layer includes p-type GaN.

4. The HEMT of claim 1, wherein a thickness of the HIL is less than a critical thickness with which a depletion region formed by the HIL does not affect the channel layer.

5. The HEMT of claim 4, wherein the thickness of the HIL is about 20 nm or less.

6. The HEMT of claim 1, wherein the depletion forming layer has a thickness of about 30 nm to about 150 nm.

7. The HEMT of claim 1, further comprising:
    an n-type semiconductor layer between the depletion forming layer and the gate electrode.

8. The HEMT of claim 1, further comprising:
    an etching stop layer between the HIL and the depletion forming layer.

9. The HEMT of claim 8, wherein
    the etching stop layer includes at least one of an $In_{x1}Ga_{1-x1}N$ layer, an $Al_{x2}Ga_{1-x2}N$ layer, and an $Al_{x3}In_yGa_{1-x3-y}N$ layer,
    $0<x1<1$,
    $0<x2<1$,
    $0<x3<1$,
    $0<y<1$, and
    $x3+y<1$.

10. The HEMT of claim 9, further comprising:
    an n-type semiconductor layer between the depletion forming layer and the gate electrode.

11. The HEMT of claim 1, wherein a shape of the depletion forming layer corresponds to a shape of the gate electrode.

12. The HEMT of claim 1, wherein the source and drain electrodes contact at least one of the channel layer and the channel supply layer.

13. A high-electron mobility transistor (HEMT) comprising:
    a channel layer;
    a channel supply layer on the channel layer,
        the channel supply layer being configured to form a two-dimensional electron gas (2DEG) in the channel layer;
    a source electrode and a drain electrode spaced apart from each other on at least one of the channel layer and the channel supply layer;
    a gate electrode on a portion of the channel supply layer that is between the source electrode and the drain electrode;
    a hole injection layer (HIL) between the gate electrode and the channel supply layer,
        the HIL being configured to inject holes into at least one of the channel layer and the channel supply layer in an on state;
    a depletion forming layer between the gate electrode and the HIL,
        the depletion forming layer configured to form a depletion region in the 2DEG,
        the depletion forming layer having a different dopant concentration than a dopant concentration of the HIL;
    at least one of an n-type semiconductor layer and an etching stop layer,
        the n-type semiconductor layer between the depletion forming layer and the gate electrode, and
        the etching stop layer between the HIL and the depletion forming layer.

14. The HEMT of claim 13, wherein
    the HIL and depletion forming layer are p-type group III-V nitride semiconductor compounds, and
    the dopant concentration of the HIL is about two to five times higher than the dopant concentration of the depletion forming layer.

15. The HEMT of claim 13, wherein
    the channel supply layer includes aluminum gallium nitride ($Al_xGa_{1-x}N$, where ($0<x<1$)),
    the HIL includes p-type GaN, and
    the depletion forming layer includes p-type GaN.

16. The HEMT of claim 13, wherein the at least one of the n-type semiconductor layer and the etching stop layer includes the n-type semiconductor layer.

17. The HEMT of claim 13, wherein the at least one of the n-type semiconductor layer and the etching stop layer includes the etching stop layer.

* * * * *